US007117455B2

(12) United States Patent
Walker et al.

(10) Patent No.: US 7,117,455 B2
(45) Date of Patent: Oct. 3, 2006

(54) SYSTEM AND METHOD FOR DERIVATIVE-FREE OPTIMIZATION OF ELECTRICAL CIRCUITS

(75) Inventors: Steven G. Walker, Chappaqua, NY (US); Chandramouli Visweswariah, Croton-on-Hudson, NY (US); Katya Scheinberg, New York, NY (US); Phillip Restle, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 10/626,762

(22) Filed: Jul. 24, 2003

(65) Prior Publication Data

US 2005/0022141 A1    Jan. 27, 2005

(51) Int. Cl.
    G06F 17/50 (2006.01)
(52) U.S. Cl. ............................................. 716/2; 703/2
(58) Field of Classification Search ...................... None
    See application file for complete search history.

(56) References Cited

U.S. PATENT DOCUMENTS

| 5,999,714 | A | 12/1999 | Conn et al. ............ 395/500.03 |
| 6,922,819 | B1 * | 7/2005 | Visweswariah ................ 716/2 |

OTHER PUBLICATIONS

Antreich et al., "An Interactive Optimization Technique for the Nominal Design of ICS," IEEE Trans. on Circuits and Systems, vol. CAS-31, No. 2, Feb. 1984, pp. 203-212.*
Chen, "A Least pth Optimization Algorithm Without Calculating Derivatives," IEEE Trans. on Circuits and Systems, vol. CAS-28, No. 4, Apr. 1981, pp. 331-337.*

Doganis et al., "General Optimization and Extraction of IC Device Model Parameters," IEEE Trans. on Electron Devices, vol. ED-30, No. 9, Sep. 1983, pp. 1219-1228.*
Gonzaga et al., "An Improved Algorithm for Optimization Problems with Functional Inequity Constraints," IEEE Trans. on Automatic Control, vol. AC-25, No. 1, Feb. 1980, pp. 49-54.*
Trahan et al., "A Derivative-Free Algorithm for a Class of Infinitely Constrained Problems," IEEE Trans. on Automatic Control, vol. AC-25, No. 1, Feb. 1980, pp. 54-61.*
SNOPT:An SQP Algorithm For Large-Scale Consrianed Optimization, by: Philip E. Gill, Walter Murray and Michael A. Saunders, pp. 979-1006, no date.

(Continued)

*Primary Examiner*—Leigh M. Garbowski
(74) *Attorney, Agent, or Firm*—Keusey, Tutunjian & Bitetto, P.C.; Rafael Perez-Pineiro, Esq.

(57) ABSTRACT

The present invention is a system and method for optimizing electrical circuits by means of derivative-free optimization. Tunable parameters such as component values, transistor sizes or model parameters are automatically adjusted to obtain an optimal circuit. Any method of measuring the performance of the circuit, including computer simulation, can be incorporated into the optimization technique, with no derivative requirements. An arbitrary continuous optimization problem can be posed, including an objective function, equality and inequality constraints, and simple bounds on the tunable parameters. The optimization technique is efficient and guarantees that it will find a locally optimal solution from any starting point. Further, the procedure includes a method of automatically recovering from electrical failure to enable automatic and productive circuit optimization. A set of measurement widgets is provided to automatically introduce the checking required to recover from electrical failure. The automated circuit optimization leads to higher quality circuits, increases designer productivity, results in a better understanding of the tradeoffs inherent in the circuit and lifts the thinking of the circuit designer to a higher level.

20 Claims, 2 Drawing Sheets

OTHER PUBLICATIONS

JiffyTune: Circuit Optimization Using Time-Domain Sensitivities, by: Andrew R. Conn, Paula K. Coulman, Ruud A. Haring, Gregory L. Morrill, Chandu Visweswariah, Senior Member, IEEE, and Chai Wah Wu, Member, IEEE, no date, page #.

Gradient-Based Optimization of Custom Circuits Using a Static-Timing Formulation, by: A.R. Conn, I.M. Elfadel, W.W. Molzen, Jr., P.R. O'Brien, P.N. Strenski, C. Visweswariah, C.B. Whan, *IBM Thomas J. Watson Research Center, *IBM Electronic Design Automation, no date, page#.

Sprice2: A Computer Program To Simulate Semiconductor Circuits by Laurence W. Nagel, Memorandum No. ERL-M520, May 9, 1975, Electronics Research Laboratory College of Engineering, University of California, Berkeley, CA 94720, no page #.

Direct Search Methods: Once Scorned, Now Respectable*, by: Margaret H. Wright, AT&T Bell Laboratories, Murray Hill, New Jersey 07974, no date, page #.

A Derivative Free Optimization in Practice, by: A.R. Conn, IBM, T.J. Watson Center, Yorktown Heights, NY, K. Scheinberg, IBM, T.J. Watson Center, Yorktown Heights, NY Ph. L. Toint, Department of Mathematics, FUNDP, Namur, Belgium, Jul. 7, 1998, no page #.

Recent Progress in Unconstrained Nonlinear Optimization Without Derivatives, by: A.R. Conn, K. Scheinberg and Ph. L. Toint, Apr. 9, 1997, no page #.

System and Method for Optimal Waveform Shaping, IBM, no date, no page #.

* cited by examiner

SYSTEM AND METHOD FOR DERIVATIVE-FREE OPTIMIZATION OF ELECTRICAL CIRCUITS

FIELD OF THE INVENTION

This invention relates to electrical circuit design. More specifically, the invention relates to optimization of electrical circuits by tuning electrical parameters such as component values, transistor sizes and model parameters. Even more specifically, the invention relates to the optimization of electrical circuits using any method of evaluation of circuit behavior (such as a circuit simulation computer program) that does not produce derivatives.

BACKGROUND OF THE INVENTION

Electrical engineers spend a great deal of effort optimizing circuits. The goal of the optimization may be to minimize the delay or power of the circuit, subject to certain constraints. The optimization is carried out by adjusting or tuning electrical parameters such as component values, transistor sizes and model parameters. Traditionally, electrical engineers simulate the circuit using a circuit simulation computer program to determine the behavior and performance of the circuit. They inspect the results of the simulation and use their intuition or experience to change the tunable parameters and then re-simulate the circuit to determine whether the changes improved the circuit. This process is repeated until the circuit has sufficiently been improved, the product schedule does not permit further optimization or the optimization task is deemed to be impossible or too difficult.

Unfortunately, the above procedure is manual, tedious, error-prone and relies on the intuition (and perhaps luck) of the designer. Therefore, it is desirable to develop automated methods of optimizing circuits. Automatic circuit optimization yields circuits of higher quality or better performance. Automated methods also offer other benefits such as increased designer productivity, better means of understanding the tradeoffs inherent in the design, and lifting of the level of thinking of the designer to a higher level.

Optimization implies minimization or maximization of some objective (such as power or delay), often subject to constraints (such as cost, area, component value limits or transistor size limits). The objective and constraints are often nonlinear functions of the tunable parameters; hence we are interested in nonlinear optimization methods. Most nonlinear optimization software packages, such as SNOPT [Ph. E. Gill, W. Murray and M. A. Saunders, "SNOPT: An SQP Algorithm for Large-Scale Constrained Optimization," Siam Journal on Optimization, Vol. 12(2002), No. 4, pp. 979–1006], require derivatives of the nonlinear functions of the optimization problem with respect to each tunable parameter. The first derivative of a function $f$ with respect to a tunable parameter x, denoted $$\frac{\partial f}{\partial x},$$

gives the optimizer an idea of how the function $f$ will change with a small change in the parameter x. First-order derivatives are also called "gradients" or "sensitivities." The availability of derivatives enables the solution of large nonlinear optimization problems, with as many as 10s of 1000s of tunable parameters, as demonstrated by the dynamic circuit optimization software JiffyTune [A. R. Conn, P. K. Coulman, R. A. Haring, G. L. Morrill, C. Visweswariah and C. W. Wu, "JiffyTune: circuit optimization using time-domain sensitivities," IEEE Transactions on Computer-Aided Design of Circuits and Systems, volume 17(12), December 1998, pages 1292–1309] and the static circuit optimization software EinsTuner [A. R. Conn, I. M. Elfadel, W. W. Molzen, Jr., P. R. O'Brien, P. N. Strenski, C. Visweswariah and C. B. Whan, "Gradient-based optimization of custom circuits using a static-timing formulation," Proceedings of the 1999 ACM/IEEE Design Automation Conference, June 1999, New Orleans, La., pages 452–459]. There is a wealth of information and literature on derivative-based nonlinear optimization methods.

Unfortunately, there are many situations in which derivatives are not available. For example, a design problem may require actual fabrication or assembly of a circuit to measure the values of the objective and constraints. Or the circuit may require simulation by means of a legacy software simulation package whose source code is not available for modification to implement a derivative calculation capability. Or the circuit may have special requirements that dictate that it be simulated by a certain simulator such as SPICE [L. W. Nagel, "SPICE2, a computer program to simulate semiconductor circuits," Technical Report, University of California at Berkeley, number UCB/ERL M520, May 1975] in which it may be impossible or prohibitive to implement a derivative calculation capability. Or the circuit models may be too complicated or even unavailable, making the necessary chain-ruling of derivatives impossible. In all of these situations, any automated solution is forced to use derivative-free optimization techniques. The situation is further complicated by the fact that simulation of the underlying circuit is often computationally intensive.

Problems with the Prior Art

Prior-art derivative-free circuit optimization techniques fall into two broad categories. In the first category, heuristic methods of optimization such as the Nelder and Mead algorithm [M. H. Wright, "Direct Search Methods: Once Scorned, Now Respectable," Numerical Analysis 1995: Proceedings of the 1995 Dundee Biennial Conference in Numerical Analysis, Eds. D. F. Griffiths and G. A. Watson, pp. 191–208, Addison Wesley Longman, 1996] are employed to attempt to improve the circuit. These methods do not possess any guarantee of convergence to even a local optimum, and can require a very large number of computationally intensive circuit simulations to obtain a result. In fact, it can be shown that the Nelder and Mead algorithm is incapable in certain circumstances of solving even a 2-variable unconstrained convex minimization problem. Thus, this category of techniques suffers from long run times, often poor quality of results and the lack of a guarantee of optimality.

The second set of prior-art techniques employs finite differencing to obtain derivatives, and then appeals to standard nonlinear optimization methods to conduct the optimization. Unfortunately, if there are n tunable parameters, each iteration of the optimization would require at least (n+1) simulations of the underlying circuit, one simulation to determine the objective function and constraint values, and n simulations in each of which one tunable parameter is perturbed by a small amount. The difference between the circuit measurements with and without perturbing each tunable parameter yields an approximation of the derivative of the measurements with respect to the parameter that was perturbed.

Unfortunately, this second set of techniques suffers from several problems. First, the number of simulations of the circuit quickly grows excessive and therefore the computer run time of the overall optimization is prohibitive. Second, these techniques suffer from numerical problems. The resulting measurements from all simulation programs suffer from numerical noise, because of finite-precision arithmetic on a computer, because of tolerances used to judge the convergence of iterative techniques within the simulator, and because of discretizations used in the simulator models. So, if the amount of perturbation used in the finite differencing is too small, the derivative obtained may be noisy or even incorrect, leading to increased computer time or even non-convergence in the overall optimization. However, if the amount of the perturbation used in the finite differencing is too large, the derivatives are inaccurate and can lead to the same type of problems.

Both sets of techniques suffer from another insidious problem—that of "electrical failure." For example, assume that the goal of the optimization is to minimize the time at which a certain digital signal switches from a low voltage to a high voltage. If the optimizer makes a certain adjustment in the tunable parameters at some iteration of the optimization, the circuit may cease to function as designed, and the signal of interest may not even switch from a low to a high voltage. In this case, there is no way of measuring the switching time, and this type of situation is referred to as electrical failure. In a derivative-free context, electrical failure is common and causes the optimization procedure to grind to a halt. In the beginning phases of derivative-free optimization, the optimizer has no idea of how the measured objective and constraints vary with changes in the tunable parameters. Thus, it is likely to take a "wild" or "inappropriate" step which violates some tacit assumptions in the circuit design, leading to electrical failure. Electrical failure leads to a dead-end in the optimization procedure, and the designer has to then pose additional constraints or optimization criteria to try to prevent such failure in subsequent invocations of the optimization program. This procedure can defeat the goal of automated and productive circuit optimization.

The references cited above are herein incorporated by reference in their entirety.

OBJECTS OF THE INVENTION

An object of this invention is an improved system and method of derivative-free optimization of electrical circuits.

Another object of this invention is an automated and efficient technique for derivative-free optimization of electrical circuits.

Yet another object of this invention is a technique for derivative-free optimization of electrical circuits with a guarantee of finding an optimal circuit.

Still another object of this invention is a method of automated recovery from electrical failure during derivative-free electrical circuit optimization.

A further object of the invention is a set of measurement widgets which automatically provide for recovery from electrical failure during derivative-free optimization of electrical circuits.

SUMMARY OF THE INVENTION

The present invention is a system and method for optimizing electrical circuits by means of derivative-free optimization. Tunable parameters such as component values, transistor sizes or model parameters are automatically adjusted to obtain an optimal circuit. Any method of measuring the performance of the circuit, including computer simulation, can be incorporated into the optimization technique, with no derivative requirements. An arbitrary continuous optimization problem can be posed, including an objective function, equality and inequality constraints, and simple bounds on the tunable parameters. The optimization technique is efficient and guarantees that it will find a locally optimal solution from any starting point. Further, the procedure includes a method of automatically recovering from electrical failure to enable automatic and productive circuit optimization. A set of measurement widgets is provided to automatically introduce the checking required to recover from electrical failure. The automated circuit optimization leads to higher quality circuits, increases designer productivity, results in a better understanding of the tradeoffs inherent in the circuit and lifts the thinking of the circuit designer to a higher level.

BRIEF DESCRIPTION OF THE FIGURES

The foregoing and other objects, aspects, and advantages will be better understood from the following non-limiting detailed description of preferred embodiments of the invention with reference to the drawings that include the following.

DETAILED DESCRIPTION OF THE INVENTION

Figure 1:
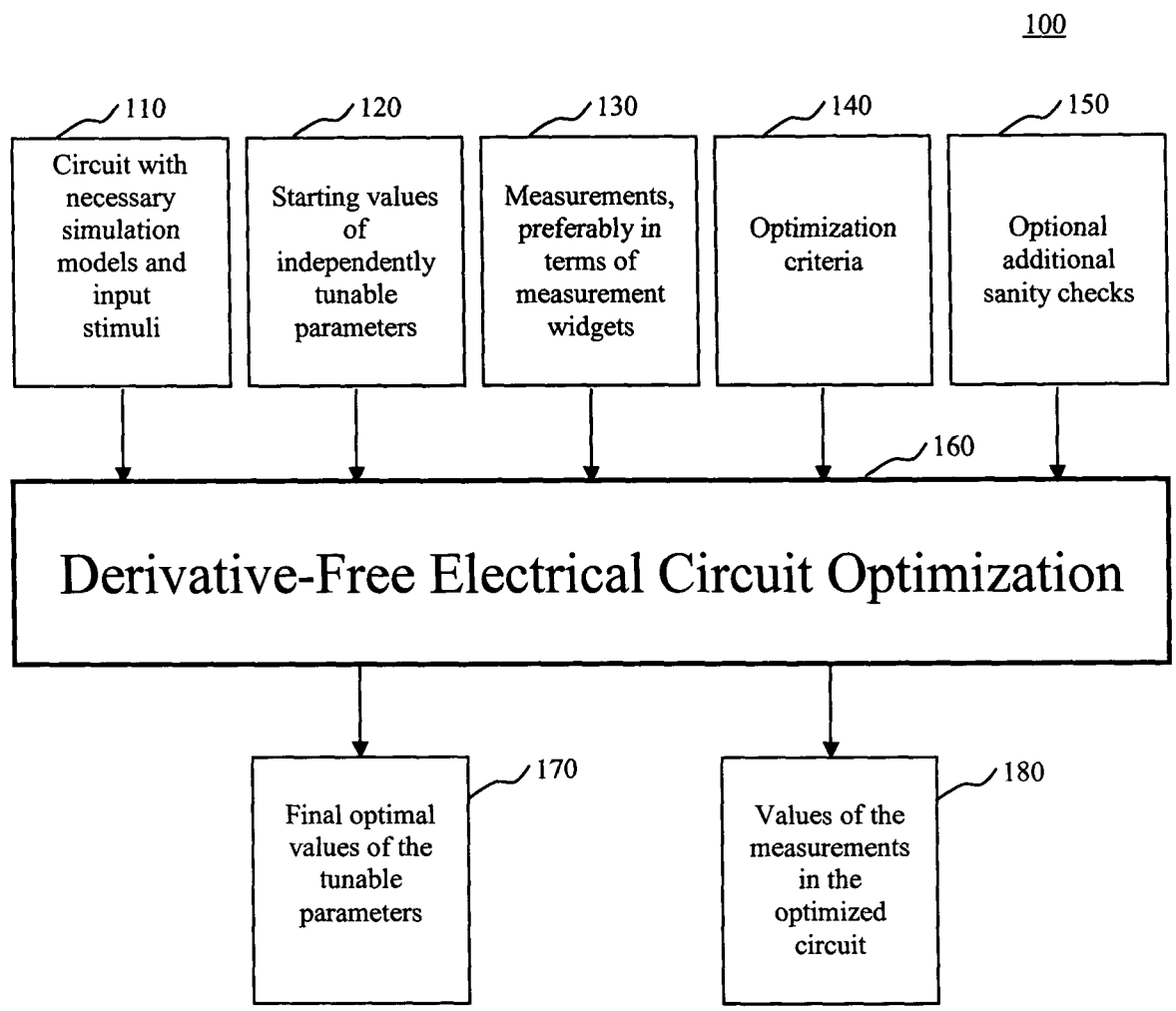
FIG. 1 is a block diagram of a preferred embodiment of a derivative-free electrical circuit optimization system.

An inventive circuit optimization flow is shown in the block diagram FIG. 1, and labeled as flow 100. There are five sets of inputs to the inventive circuit optimization. The first, labeled box 110, is the circuit description together with all the information necessary to simulate the circuit such as device models and wire models. Also included in box 110 is the set of input stimuli or waveforms required to appropriately drive the circuit at its input ports. The next set of inputs, labeled box 120, is a set of starting values for the independently tunable parameters. The only requirement for the starting values is that they result in a circuit which has no electrical failures. It is to be noted that violation of one or more constraints does not constitute an electrical failure. The next set of inputs, labeled box 130, is a set of measurements. A measurement is a circuit response or circuit behavior which is determined from the simulation of the circuit. The inventive circuit optimization flow provides for the notion of measurement widgets for which sanity checks to determine electrical failure are automatically generated. These widgets will be explained in more detail in the subsequent paragraph. Box 140 shows the next input to the flow, which is a set of optimization criteria. These criteria include the definition of an objective to be minimized or maximized as a function of the aforementioned measurements or tunable parameters themselves; the definition of zero or more constraints, each of which can be an inequality, less-than or greater-than constraint, each constraint being a function of the aforementioned measurements or tunable parameters themselves; simple bounds being optional lower and upper limits on the values of the tunable parameters; specification of dependent parameters whose values are determined by an arbitrary continuous function of the independently tunable parameters; and optimization settings such as the tolerance for constraint satisfaction, the accuracy to which the problem must be solved and the maximum number of simulations to be attempted. Finally, box 150 shows that additional sanity checks to detect electrical failure over and above those introduced automatically by measurement widgets can be provided by the circuit designer. All of these inputs feed into the inventive derivative-free electrical circuit optimizer, labeled box 160. Upon completion of the optimization, the optimal values of the tunable parameters are provided as an output of the flow (box 170) and the values of the objective, constraints and measurements evaluated for this optimal circuit are also reported (box 180).

As was discussed earlier, electrical failures are a particularly difficult problem in derivative-free optimization techniques. Failures are detected by means of sanity checks. Sanity checks are referred to as "virtual constraints" in [A. R. Conn, K. Scheinberg and Ph. L. Toint, "A derivative-free optimization algorithm in practice," Proceedings of the 7th AIAA/USAF/NASA/ISSMO Symposium on Multidisciplinary Analysis and Optimization, St. Louis, Mo., 1998]. A sanity check is usually defined as a valid value range on a sanity measurement; if the measurement is outside the valid value range, electrical failure has occurred. To ease the task of providing sanity checks, an inventive set of measurement widgets is employed. For example, suppose one of the measurements was the 50% crossing time of a rising signal (i.e., the time at which the signal crossed 50% of the power supply voltage in a rising direction). If that signal were never to rise above 50% of the power supply voltage, then it would result in an electrical failure. A crossing time measurement widget is defined which measures the 50% crossing time, but sets a special failure flag should the crossing not even occur during the simulation of the circuit (which is judged by the crossing time being outside of a valid value range). The failure flags of all such widgets are polled automatically after each simulation of the circuit to communicate the presence or absence of electrical failure to the nonlinear optimizer. If even one measurement widget indicated failure, the entire simulation would be considered to have had an electrical failure. The 50% crossing time widget is simply one example of a widget that not only measures some behavior or performance of the circuit, but automatically flags electrical failure.

Similar measurement widgets can be constructed for delays, slews (transition times of a digital signal), gains, noise measurements, overshoot and undershoot measurements, waveform quality metrics, and so on. It is to be understood that one of ordinary skill in the art can extend the notion of measurement widgets with automatic failure detection to a wide range of measurement types. It is natural that a circuit design project will over time build up a library of such measurement widgets.

Whether or not auto-failure-detecting widgets are used, box 150 allows the designer to provide additional sanity checks either related to a particular measurement or related to the overall health of the behavior of the circuit. This is a mechanism to guide the optimizer to stay in good regions of the space of the tunable parameters and automatically recover from electrical failures. Most importantly, with these mechanisms, an electrical failure will not cause the optimizer to grind to a halt; rather, the optimizer will automatically and gracefully recover and continue.

The procedure of box 160 is the centerpiece of flow 100. The details of the internals of this box are explained in the flowchart of FIG. 2. In box 205, the derivative-free optimization problem is defined in a form that is suitable to the derivative-free optimizer. The definition of the problem typically includes the list of independently tunable parameters; optional simple bounds (upper and lower limits) on each independently tunable parameter; an optional list of one or more dependent tunable parameters, each of which bears an arbitrary continuous functional relationship to the independently tunable parameters; the objective to be minimized or maximized as a continuous function of objective measurements and/or tunable parameters themselves; an optional list of one or more constraints, each of which may be linear or nonlinear, and each of which may be an equality, less-than inequality or greater-than inequality constraint; each constraint in turn is defined as a continuous function of constraint measurements and/or tunable parameters themselves; and some optimization settings such as the tolerance for constraint satisfaction, the accuracy to which the problem must be solved and the maximum number of simulations to be attempted. All of this information is typically communicated to the mathematical derivative-free nonlinear optimization software (called the "engine" in the sequel) by means of a programming interface or computer files.

Figure 2:
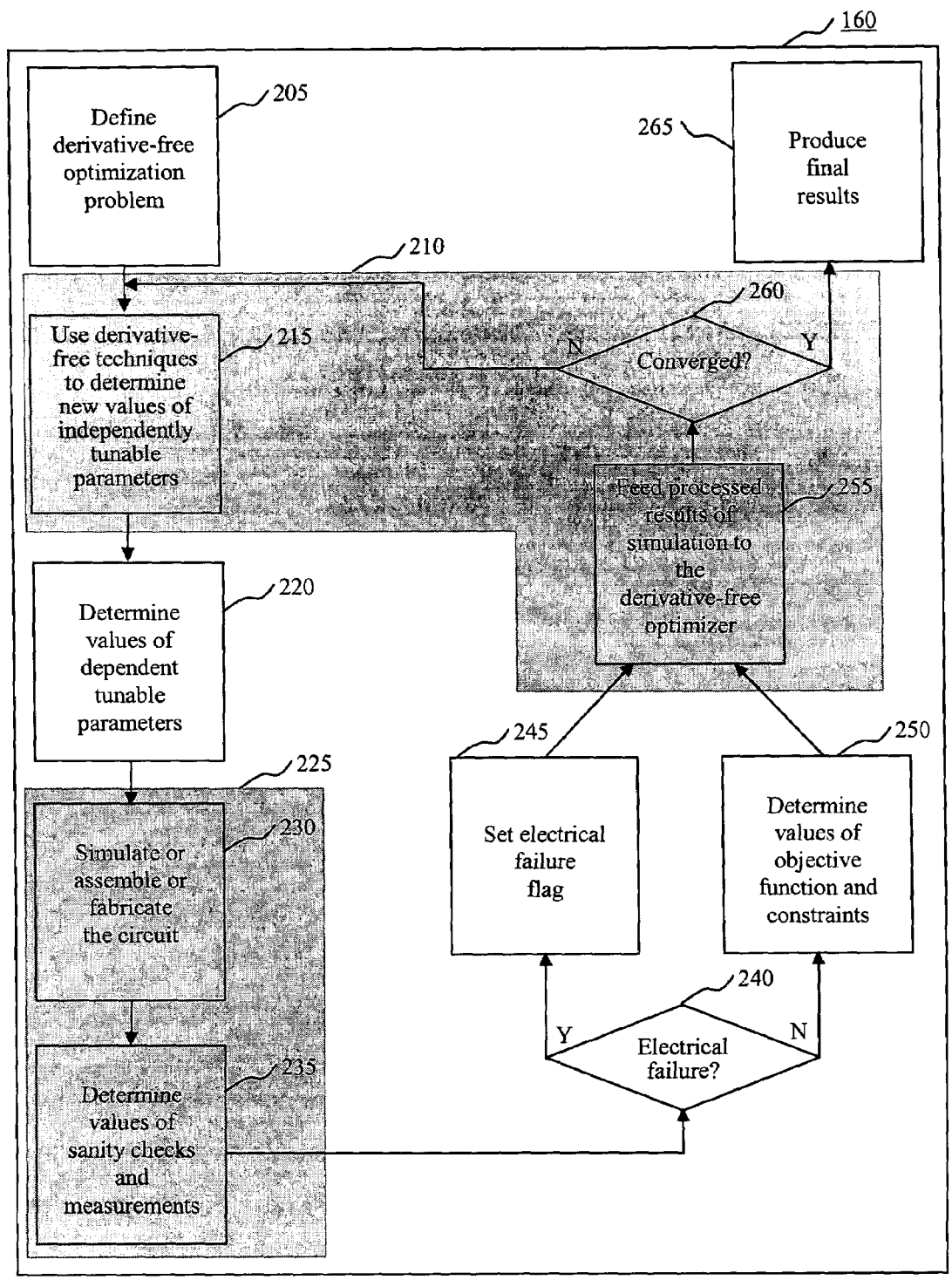
FIG. 2 is a flow chart of the preferred derivative-free electrical circuit optimization process.

The mathematical derivative-free optimization engine is shown in the grey box 210 of FIG. 2. There has been much recent research in derivative-free optimization. A survey of derivative-free optimization techniques can be found in [A. R. Conn, K. Scheinberg and Ph. L. Toint, "Recent progress in unconstrained nonlinear optimization without derivatives," Journal of Mathematical Programming, volume 79, 1997, pages 397–414]. The optimizer described in [A. R. Conn, K. Scheinberg and Ph. L. Toint, "A derivative-free optimization algorithm in practice," Proceedings of the $7^{th}$ AIAA/USAF/NASA/ISSMO Symposium on Multidisciplinary Analysis and Optimization, St. Louis, Mo., 1998] is the optimizer of choice in the preferred embodiment. These references are herein incorporated by reference in their entirety.

It is to be understood that the inventive methods described herein are applicable by employing this or any other derivative-free mathematical optimization engine. Although the optimizer consists of three distinct portions, boxes 255 and 260 will be described later. In box 215, the derivative-free optimization engine determines a trial point in n dimensional space, where n is the number of independently tunable parameters.

In box 220, the values of all the tunable parameters are determined, since the dependent parameters have been provided as a function of the independently tunable parameters. At this point, the value of each of the tunable parameters is known, and all the details required for circuit simulation are available; this information is collectively called a trial circuit. It is to be understood that while FIG. 2 and the preferred embodiment assume that the behavior of the trial circuit is determined by performing a computer simulation of the circuit, the inventive method can be applied to any means of determining the circuit behavior including but not limited to actually fabricating the circuit, simulating the circuit on a computer, emulating a circuit, appealing to models of circuit behavior or a mixture thereof.

The circuit simulator is shown by the lower grey box 225, and consists of two parts. In box 230, the actual circuit simulation is carried out. In box 235, the value of each of the measurements and sanity checks is queried from the simulator. It is common for circuit simulation program to have an efficient re-run capability. The first simulation of the circuit requires certain steps such as parsing input files, initializing models and setting up matrix structures; these steps can be avoided during any re-runs of the same circuit but with a different choice of tunable parameters. Hence the preferred embodiment is implemented in such a manner as to take full advantage of this efficient re-run capability.

In box 240, an electrical failure check is conducted. All of the sanity checks automatically introduced by the measurement widgets of box 130 of FIG. 1, as well as any optional sanity checks supplied in box 150 of FIG. 1, are polled. If the value of a sanity check is outside its corresponding valid value range, the sanity check is said to be violated. If even one sanity check was violated, electrical failure is declared. In this case, the values of the remaining measurements and/or sanity checks are immaterial, and an electrical failure flag is set in box 245 and control is returned to the derivative-free optimizer (box 210). If, however, every sanity check is passed, the values of the objective and constraints are determined in box 250 and communicated to the derivative-free optimization engine (box 210).

In box 255, the derivative-free optimization engine digests the values of the objective function and constraints. If electrical failure has been detected, then the optimizer tries to recover from the failure by a variety of methods. In the preferred optimizer [see A. R. Conn, K. Scheinberg and Ph. L. Toint, "A derivative-free optimization algorithm in practice," Proceedings of the $7^{th}$ AIAA/USAF/NASA/ISSMO Symposium on Multidisciplinary Analysis and Optimization, St. Louis, Mo., 1998, incorporated herein by reference in its entirety], the trust-region radius is reduced; in other words, the optimizer tries to find a new trial point that is geographically closer to the last non-failing trial circuit. If failure persists, the optimizer tries different methods of producing an analytical quadratic model of the nonlinear objective and constraints. These methods work well in practice. Automatic insertion of sanity checks, automatic detection of electrical failure and automatic recovery are key ingredients of productive circuit optimization in the inventive method.

If electrical failure is not detected, the nonlinear optimizer makes a judgment as to whether convergence has been obtained (box 260). If not, the optimization engine returns to step 215 to process all the information obtained so far from repeated simulations of the circuit, in order to determine a new trial point. If convergence has been obtained or the maximum number of simulations has been reached, the final values of the tunable parameters and the corresponding measurement, objective and constraint values are reported (box 265) and the procedure terminates.

Once the procedure terminates, the designer typically back-annotates the tunable parameters to the circuit design and proceeds to the next design step or commits the design to manufacturing.

It is to be understood that the inventive circuit optimization method can be extended in several different ways by one of ordinary skill in the art. The underlying circuit simulation can be in the time-domain or frequency-domain, with corresponding measurements and measurement widgets. Each simulation in the inventive method can be replaced by multiple simulations of the same circuit under different environmental or manufacturing conditions, and the objective function and constraints can be defined in terms of the union of the measurements across the multiple simulations.

It is further to be understood that a broad range of types of measurements, objective functions and constraints can be defined depending on the type of circuit and the goals of the optimization. Measurements like power, delay, slew, overshoots and undershoots are obvious candidates. Various integral measures of noise can be constrained or minimized as taught by [A. R. Conn, R. A. Haring and C. Visweswariah, "Method for incorporating noise considerations in automatic circuit optimization," U.S. Pat. No. 5,999,714, issued Dec. 7, 1999]. Even waveform quality can be a measurement, wherein the metric that is minimized or constrained is the integral of the absolute difference between a desired waveform and an actual waveform as taught by [C. Visweswariah, "System and method for optimal waveform shaping," U.S. Patent application filed as docket YOR920030022US1 on Jan. 29, 2003]. The maximum of a set of measurements, such as delays, can also easily be minimized by derivative-free techniques. These references are herein incorporated by reference in their entirety.

It is yet further to be understood that various forms of pre- and post-processing can be applied to make the inventive method more useful in practice. For example, after the optimization, the continuously optimized parameters can be snapped to the nearest point on a manufacturing grid of allowed component values and/or sizes. If the designer suspects that the circuit has multiple optimal points within the search space, or does not wish to manually search for a set of starting parameter values that cause no electrical failures, the optimization can be preceded by a sweep procedure in which the search space is coarsely sampled, and the most promising sample point used as the start point of the optimization. Other more sophisticated sampling techniques and the use of multiple start points can be envisioned in order to more thoroughly explore the search space of the optimization.

It is also to be understood that the objective function may not be completely determined when the optimizations are carried out. For example, both minimum power and minimum delay may be desired, but the relative importance of power and delay may not be known a priori. In this case, the optimization process may be repeated a number of times with different weighting on various components of the objective function (in this example, power and delay). The results of these multiple optimizations will be a tradeoff curve such as a power vs. delay curve. A tradeoff curve between two quantities can also be generated by repeatedly invoking the optimizer with successively tighter constraints on one quantity while minimizing the other quantity. Each point on the tradeoff curve is optimal for a certain weighting between the two quantities. The circuit designer can then later choose which point on the tradeoff curve to use for a particular application. This example can be generalized to enable many tradeoffs such as area vs. performance, delay vs. noise-margin, etc., to be studied accurately and objectively. The tradeoff curves can also be multi-dimensional.

Thus, it is to be understood that, based on this invention, it is possible for one of ordinary skill in the art to automatically optimize any tunable parameters of any electrical circuit to any optimization criteria; a wide range of tunable parameters, measurements, objectives, constraints, measurement widgets and additional sanity checks can be envisioned to support a rich circuit optimization capability.

We claim:

1. A method for optimizing an electrical circuit, comprising the steps of:
   a. Providing an objective to be minimized and one or more independently tunable parameters to a derivative-free optimizer, the objective being defined as an objective measurement of the behavior of a circuit;
   b. Receiving a value of each of the one or more independently tunable parameters from the derivative-free optimizer;

c. Providing each of the one or more independently tunable parameter values to a circuit simulator;
d. Receiving from the simulator the value of the objective measurement;
e. Providing the objective value to the derivative free optimizer; and
f. Repeating steps (b) through (e) until the derivative-free optimizer determines that the objective has converged to a minimum within a convergence tolerance.

2. A method as in claim 1, in which the goal of the optimization is to maximize the objective.

3. A method as in claim 1, in which each of the one or more independently tunable parameters has one of an upper bound, a lower bound, both an upper bound and a lower bound, and neither an upper bound nor a lower bound.

4. A method as in claim 1, in which the objective to be minimized is a continuous function of one or more objective measurements.

5. A method as in claim 1, in which one or more additional dependent tunable parameters are simultaneously optimized, each of the one or more additional dependent tunable parameters being defined as a continuous function of the one or more of the independently tunable parameters.

6. A method for optimizing an electrical circuit, comprising the steps of:
a. Providing an objective to be minimized, one or more constraints to be met, and one or more independently tunable parameters to a derivative-free optimizer, the objective being defined as an objective measurement of the behavior of the circuit and each of the one or more constraints being defined as a constraint measurement of the behavior of the circuit;
b. Receiving a value of each of the one or more independently tunable parameters from the derivative-free optimizer;
c. Providing each of the one or more independently tunable parameters to a circuit simulator;
d. Receiving from the simulator the value of the objective measurement and the value of each of the one or more constraint measurements;
e. Providing the objective value and the value of each of the one or more constraints to the derivative-free optimizer;
f. Repeating steps (b) through (e) until the derivative-free optimizer determines that the objective function has converged to a minimum subject to the one or more of the constraints to within a convergence tolerance.

7. A method as in claim 6, in which the goal of the optimization is to maximize the objective subject to satisfying each of the one or more of the constraints.

8. A method as in claim 6, in which each of the one or more independently tunable parameters has one of an upper bound, a lower bound, both an upper bound and a lower bound, and neither an upper bound nor a lower bound.

9. A method as in claim 6, in which each of the one or more constraints is one of an equality constraint, less-than inequality constraint and greater-than inequality constraint.

10. A method as in claim 6, in which each of the one or more constraints is one of a linear constraint and a nonlinear constraint.

11. A method as in claim 6, in which the objective to be minimized is a continuous function of one or more objective measurements.

12. A method as in claim 6, in which each of the one or more constraints is a continuous function of one or more constraint measurements.

13. A method as in claim 6, in which one or more additional dependent tunable parameters are simultaneously optimized, each of the one or more additional dependent tunable parameters being defined as a continuous function of the one or more of the independently tunable parameters.

14. A method as in claims 1 or 6, in which the simulation of the circuit is in one or more of the time domain and the frequency domain.

15. A method as in claims 1 or 6, further including constraint measurements and sanity measurements on the tunable parameters in which each of the objective measurement, constraint measurements and sanity measurements is one of: a power measurement, a delay measurement, a noise measurement, a transition time measurement, a current measurement, a voltage measurement, an overshoot measurement, an undershoot measurement, a gain measurement, a phase measurement, a temperature measurement, a component value measurement, a component size measurement, a model parameter measurement and a waveform quality measurement.

16. A method as in claims 1 or 6, in which the behavior of the circuit is determined by one or more of computer simulation, emulation, circuit assembly, circuit fabrication and analytic modeling.

17. A method as in claims 1 or 6, further including constraint measurements and sanity measurements on the tunable parameters in which the circuit is simulated at a variety of environmental and manufacturing settings, each of the simulations contributing to the objective, constraint and sanity measurements.

18. A method as in claims 1 or 6, in which each of the tunable parameters is one of a component value, a model parameter value, a transistor size, a wire size, a wire spacing, an operating temperature, a manufacturing condition and a power supply voltage.

19. A method as in claims 1 or 6, the circuit being one or more of a digital circuit, analog circuit, communication circuit, input/output circuit, amplifier circuit and clock distribution circuit.

20. A method as in claims 1 or 6, wherein the optimizing the electrical circuit includes one of dynamic circuit optimization and static circuit optimization.

* * * * *